United States Patent
Dyer et al.

(10) Patent No.: US 11,342,929 B2
(45) Date of Patent: May 24, 2022

(54) OFFSET CALIBRATION FOR SUCCESSIVE APPROXIMATION REGISTER ANALOG TO DIGITAL CONVERTER

(71) Applicant: Rambus Inc., San Jose, CA (US)

(72) Inventors: Kenneth C. Dyer, Pleasanton, CA (US); Marcus Van Ierssel, Toronto (CA)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/262,901

(22) PCT Filed: Jul. 30, 2019

(86) PCT No.: PCT/US2019/044052
§ 371 (c)(1),
(2) Date: Jan. 25, 2021

(87) PCT Pub. No.: WO2020/028311
PCT Pub. Date: Feb. 6, 2020

(65) Prior Publication Data
US 2021/0167789 A1    Jun. 3, 2021

Related U.S. Application Data

(60) Provisional application No. 62/771,519, filed on Nov. 26, 2018, provisional application No. 62/714,538, filed on Aug. 3, 2018.

(51) Int. Cl.
*H03M 1/10*    (2006.01)
*H03M 1/06*    (2006.01)

(52) U.S. Cl.
CPC ....... *H03M 1/1023* (2013.01); *H03M 1/0639* (2013.01)

(58) Field of Classification Search
CPC .... H03M 1/1023; H03M 1/0639; H03M 1/04; H03M 1/0607; H03M 1/1215; H03M 1/46
(Continued)

(56) References Cited

U.S. PATENT DOCUMENTS 8,493,250 B2    7/2013    Bonaccio et al.
8,497,795 B2    7/2013    Le Tual et al.
(Continued)

OTHER PUBLICATIONS

Lukas Kull et al.,"High-Speed Data Converters", ISSCC 2013 / Session 26.4. 3 pages.
(Continued)

*Primary Examiner* — Khai M Nguyen
(74) *Attorney, Agent, or Firm* — The Neudeck Law Firm, LLC

(57) ABSTRACT

Disclosed is a successive approximation register (SAR) analog to digital converter (ADC) that uses two or more comparators. This allows the output of one comparator to be latched while the other comparators are comparing and switching. Statistical measures are used to correct the offsets of one or more of the comparators. If a statistically significant mismatch in the number of 1's and 0's occurs in a subset of the bits, adjustments to the offsets of one or more of the comparators are made until there is roughly an equal number of 1 and 0 values. This can reduce or eliminate the need for dedicated offset correction cycles.

20 Claims, 18 Drawing Sheets

(58) Field of Classification Search
USPC .......................................... 341/118, 120, 163
See application file for complete search history.

(56) References Cited

U.S. PATENT DOCUMENTS

| | | | | |
|---|---|---|---|---|
| 8,854,240 | B2* | 10/2014 | Chen | H03M 1/0678 |
| | | | | 341/118 |
| 9,496,884 | B1* | 11/2016 | Azenkot | H03M 1/1023 |
| 10,020,816 | B1* | 7/2018 | Cleris | H03M 1/069 |
| 2004/0246154 | A1 | 12/2004 | Aeby et al. | |
| 2005/0036576 | A1 | 2/2005 | Agazzi et al. | |
| 2009/0201187 | A1 | 8/2009 | Asayama et al. | |
| 2015/0229859 | A1 | 8/2015 | Guidash et al. | |
| 2016/0099722 | A1 | 4/2016 | Lin | |
| 2016/0248435 | A1 | 8/2016 | Harpe | |

OTHER PUBLICATIONS

Notification of Transmittal of the International Search Report and the Written Opinion of the International Searching Authority, or the Declaration dated Oct. 18, 2019 re: Int'l Appln. No. PCT/US2019/044052. 12 pages.

* cited by examiner

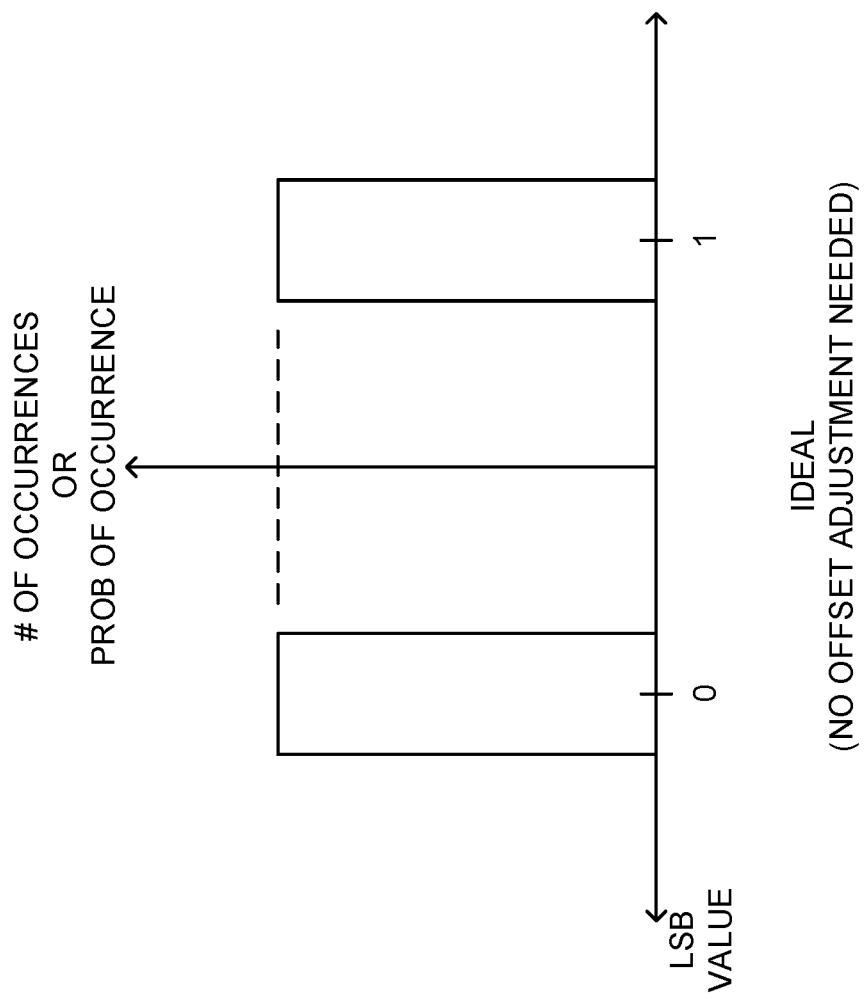

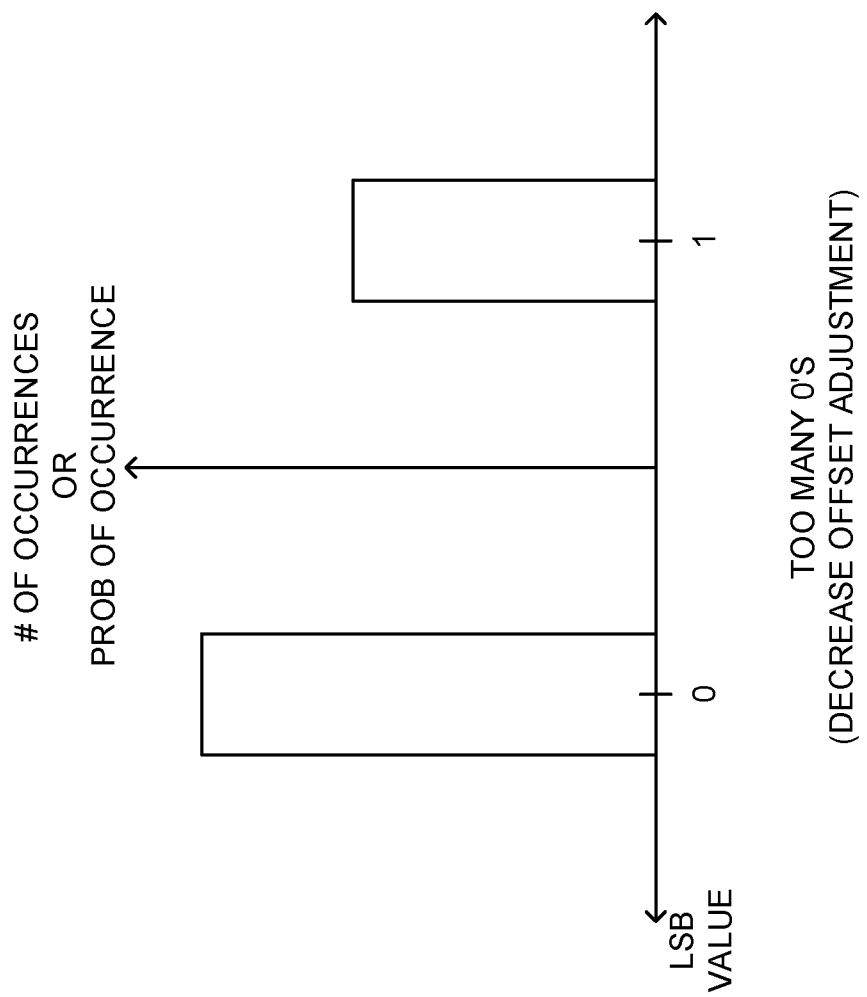

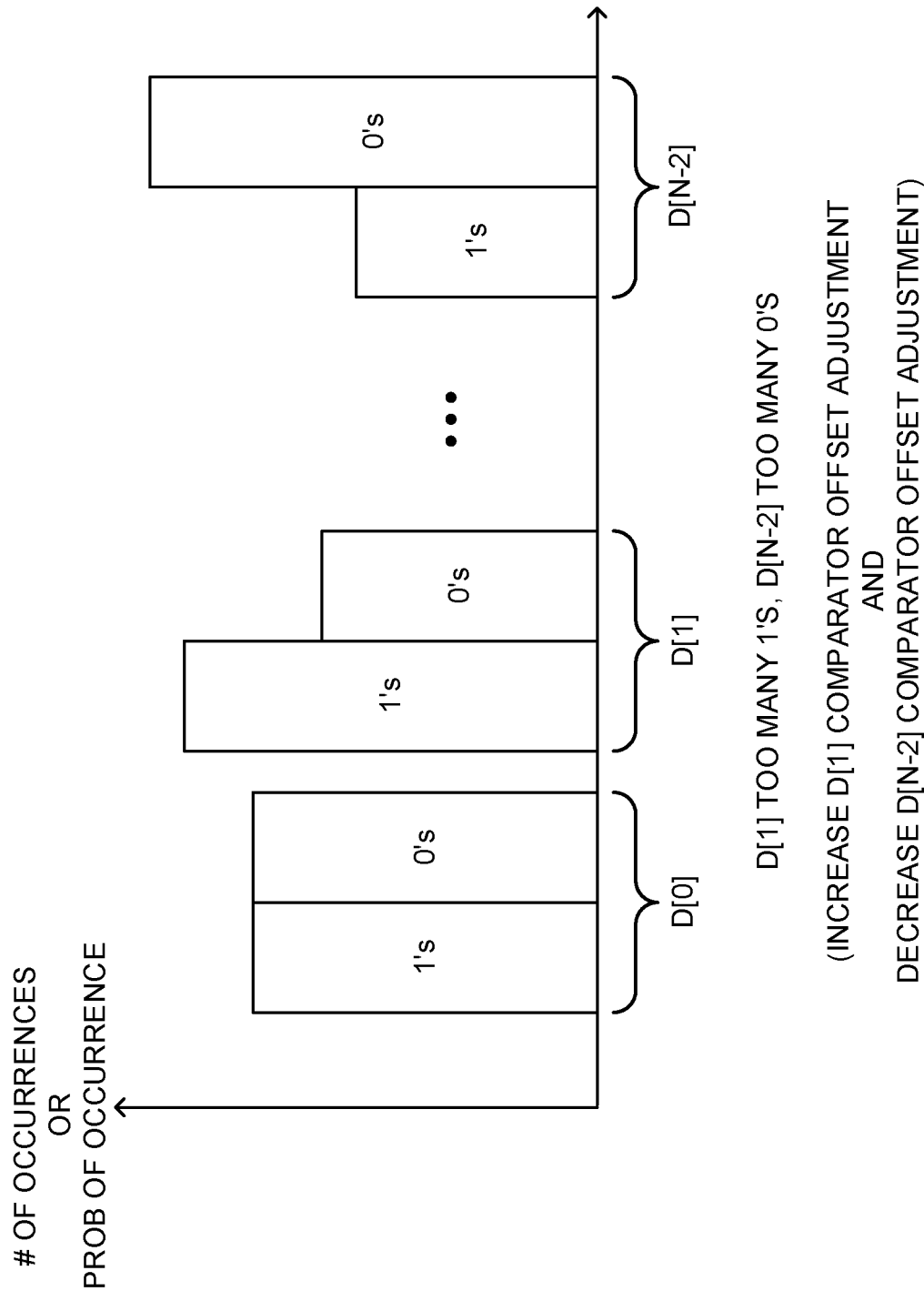

OFFSET CALIBRATION FOR SUCCESSIVE APPROXIMATION REGISTER ANALOG TO DIGITAL CONVERTER

BRIEF DESCRIPTION OF THE DRAWINGS

FIGS. 3A-3C are illustrations of distributions of least-significant bit values given a random or well distributed input signal.

FIGS. 9A-9C are illustrations of the distribution of bit values given a random, or well distributed input signal.

DETAILED DESCRIPTION OF THE EMBODIMENTS

A successive approximation register (SAR) analog to digital converter (ADC) operates like a binary search with each comparison step determining one bit of the final output. This process works from the most-significant bit to the least-significant bit. In order to speed the comparison process, two or more comparators may be utilized. This allows the multiple comparators to operate concurrently, but in staggered phases of operation. The output of the SAR ADC however, can be non-linearly distorted by mismatches in the offsets between comparators. The difference between comparator offsets can be called 'differential offset.' The 'differential offset' between a comparator that resolves bit n and a comparator that resolves bit n+1, may be reflected in the statistical distribution of bit n. The 'common-mode offset', or 'DC offset' is the offset shared in common between all comparators and contributes little or nothing to the non-linearity of the SAR ADC.

In an embodiment, statistical measures are used to correct the differential offset of comparators that resolve adjacent bits. For example, well distributed or random input signals should result in roughly an equal number of 1 and 0 values for the least-significant bit (e.g., bit #0). If a statistically significant mismatch in the number of 1's and 0's occurs, adjustments to the offset of the least-significant bit comparator can be made until there is roughly an equal number of 1 and 0 values. These adjustments drive the differential offset between the comparator that resolves bit #0, and the comparator that resolves bit #1 towards zero. Thus, reducing or eliminating the need for dedicated offset correction cycles.

Figure 1:
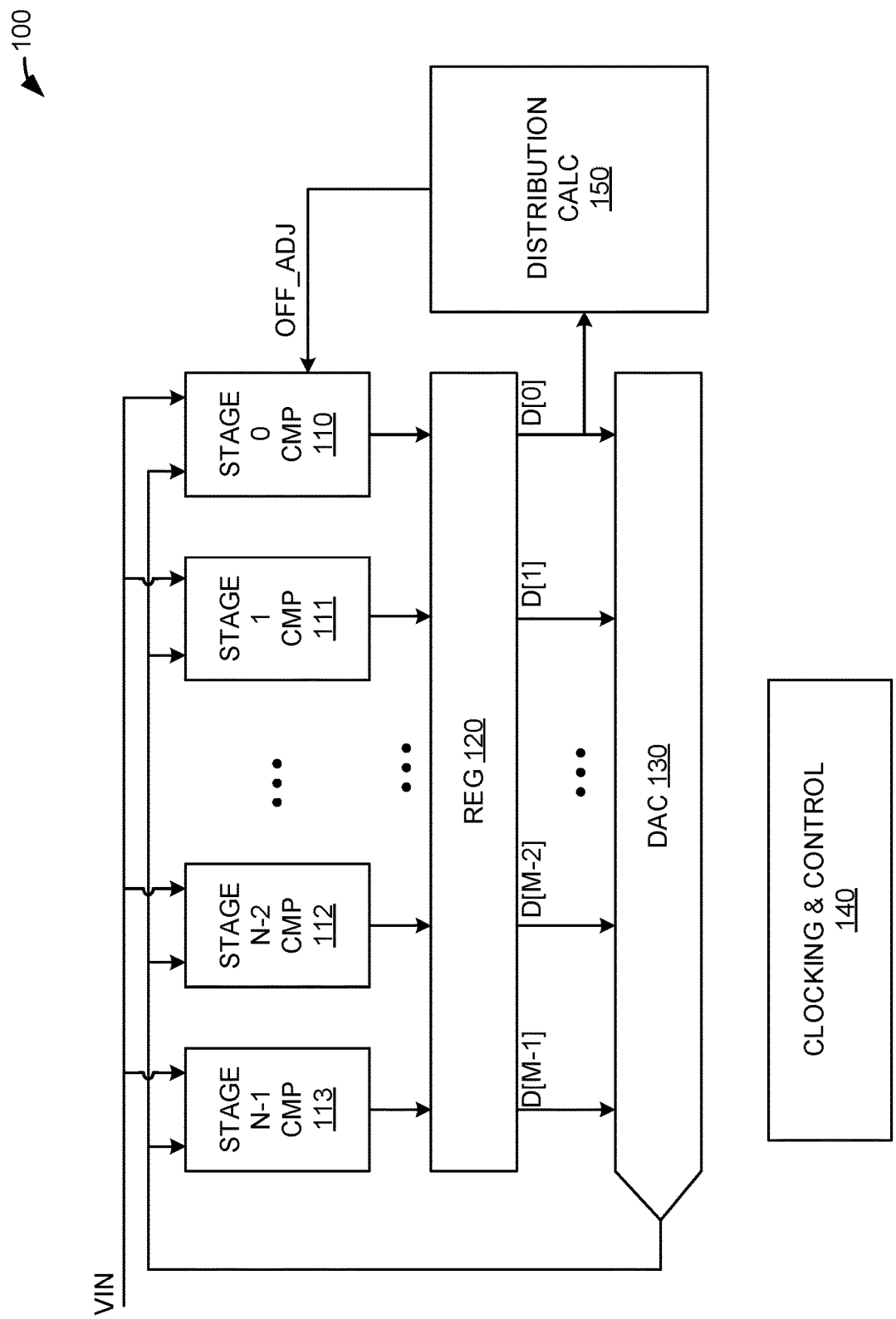
FIG. 1 is a block diagram illustrating a successive approximation register (SAR) analog to digital converter (ADC).

FIG. 1 is a block diagram illustrating a successive approximation register (SAR) analog to digital converter (ADC). In FIG. 1, SAR ADC 100 comprises N number of comparators 110-113, M-bit register 120, M-bit digital to analog converter (DAC) 130, clocking and control circuitry 140, and distribution calculation 150. SAR ADC 100 uses N number of comparators to convert the analog signal at its input (VIN) to M number of digital bits, where N is greater than or equal to 2, and M is an arbitrary integer that determines the resolution of SAR ADC 100. SAR ADC 100 may be part of an integrated circuit.

The analog signal at the input VIN may be any analog voltage to be converted to a digital value. Applications that may use analog-to-digital conversion by SAR ADC 100 include industrial (or consumer) measurement, voiceband audio, data acquisition, video, radio (e.g., IF sampling), etc. Thus, VIN may represent, for example, temperature, light, humidity, pressure, speed, position, distance, an amount, an electrocardiographic signal, an RF signal, an audio signal, and/or any analog (or digital) physical property that may be sensed/received by analog circuitry/sensors. Conversion of physical properties in and around machines (e.g., automobiles, factory equipment) has enabled many recent technological advances. These areas include, for example, antilock brakes, robotics, climate control (e.g., thermostats). Conversion of an analog RF signal to digital values has enabled many recent advances in communications by replacing analog circuitry with computer functions (e.g., software radio, mobile communications, CDMA, OFDM, OFDMA, etc.)

In operation, under the control of clocking and control circuitry 140, register 120 is initially set to ½ of the maximum value that DAC 130 can output (e.g., 100000 for M=6). In a first cycle, stage N−1 comparator 113 then compares the output of DAC 130 to the input voltage VIN to determine the value of the most-significant bit D[M−1]. The value of the most-significant bit is then loaded into register 120 which may cause DAC 130 to output a new analog voltage. In the next cycle, this new analog voltage is compared by stage N−2 comparator 112 to the input voltage VIN to determine the value of the second most-significant bit. The value of the second most-significant bit is then loaded into register 120, and so on for M number of cycles. After M number of bit values have been determined, the value in register 120 is a digital representation of the analog voltage on SAR ADC's 100 input VIN. SAR ADC 100 may then proceed to convert another analog voltage on VIN by setting the value in register 120 to ½ of the maximum value that DAC 130 can output (e.g., 100000 for M=6) and proceeding through the same process.

In an embodiment, M is an integer multiple of N. This ensures that comparator 110 is always the comparator producing the least-significant bit output by SAR ADC 100. However, other configurations are contemplated. For example, if M=7 (i.e., an odd integer) and N=2, SAR ADC 100 could be configured such that comparators 110 and 111 each produce the least-significant bit on alternating conversion cycles. A multiplexor (not shown in FIG. 1) or other logic could be used to route the respective outputs of comparators 110 and 111 to the appropriate bit position of register 120.

In an embodiment, distribution calculation 150 monitors the least-significant bit values output by SAR ADC 100 over multiple analog to digital conversions. Distribution calculation 150 monitors the least-significant bit values output by SAR ADC 100 to determine whether a statistically significant mismatch in the number of 1's and 0's is occurring. If distribution calculation 150 determines that there is a statistically significant mismatch in the number of 1's and 0's occurring, distribution calculation 150 makes an adjustment to the offset of the least-significant bit comparator 110.

For example, if distribution calculation 150 determines that there are statistically more 0's that 1's being output by comparator 110, distribution calculation 150 may change the offset of comparator 110 (e.g., via the signal OFF_ADJ) to change the threshold of comparator 110 so then there is an increased likelihood comparator 110 will output a 1 for any given comparison. Likewise, if distribution calculation 150 determines that there are statistically more 1's that 0's being output by comparator 110, distribution calculation 150 may change the offset of comparator 110 (e.g., via the signal OFF_ADJ) to change the threshold of comparator 110 so then there is an increased likelihood comparator 110 will output a 0 for any given comparison.

It should be understood that the offsets of one or more of comparators 111-113 may also be corrected. These corrections may be performed in a variety of manners. These manners may include other known calibration techniques and/or analyzing the statistical distributions associated with the comparators 111-113. Since the calibration techniques used for comparators 111-113 may not include a statistical distribution analysis, a connection between distribution calculation 150 and comparators 111-113 is not shown in FIG. 1—although in some implementations, one may exist.

In an embodiment, distribution calculation 150 is circuitry and/or software running on the same integrated circuit as the rest of SAR ADC 100. In another embodiment, distribution calculation 150 may be software running on a separate integrated circuit that can control the offset of comparator 110 (e.g., via writing to a register that controls a DAC that outputs the OFF_ADJ signal.)

Figure 2:
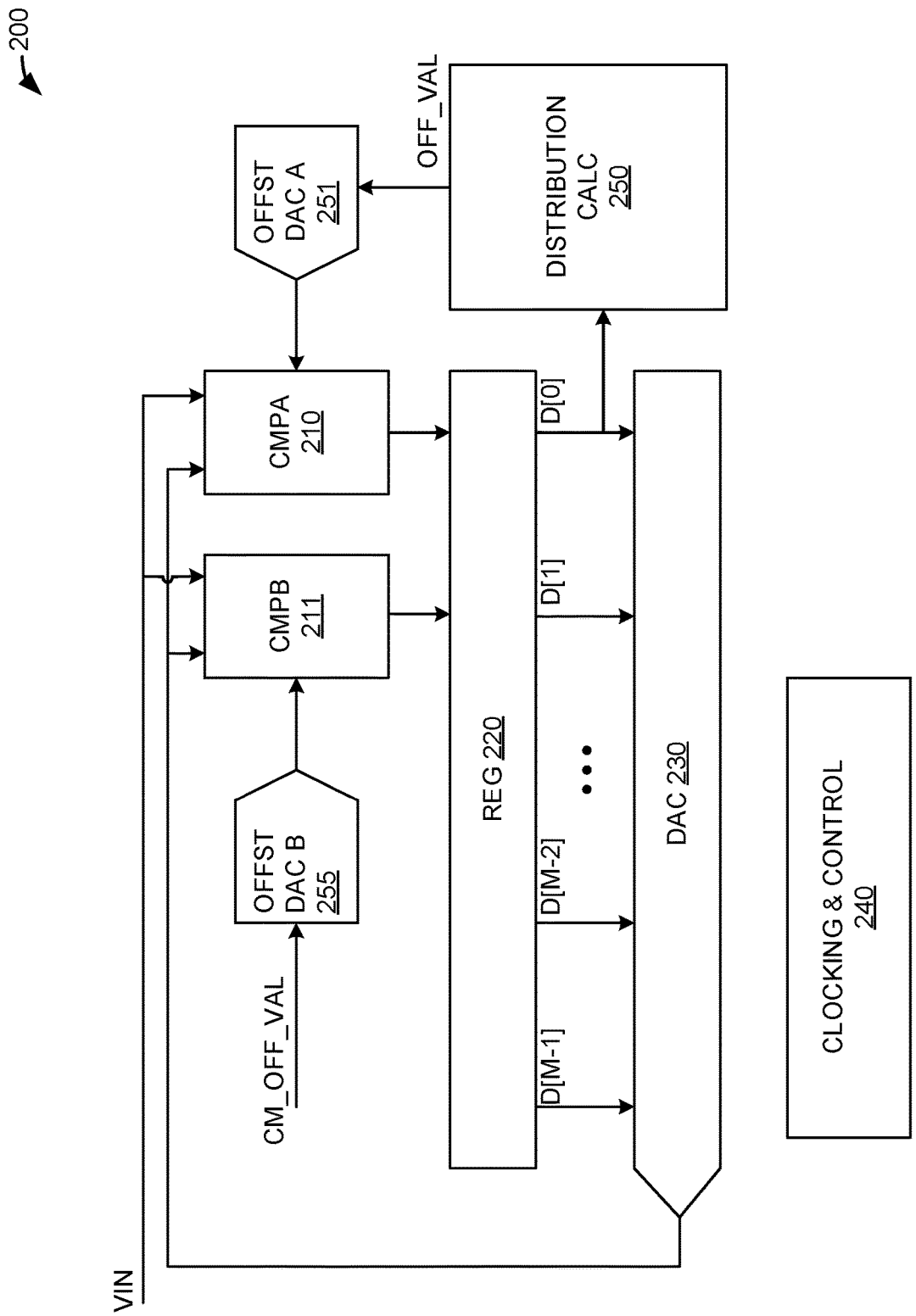
FIG. 2 is a block diagram illustrating a two comparator successive approximation register analog to digital converter.

FIG. 2 is a block diagram illustrating a two comparator successive approximation register analog to digital converter. In FIG. 2, SAR ADC 200 comprises comparator A 210, comparator B 211, M-bit register 220, M-bit digital to analog converter (DAC) 230, clocking and control circuitry 240, distribution calculation 250, offset adjust DAC A 251, and offset adjust DAC B 255. SAR ADC 200 uses two comparators 210-211 in an alternating (a.k.a., ping-pong) fashion to convert the analog signal at its input (VIN) to M number of digital bits. By using just two comparators 210-21, SAR ADC 200 may cost less to produce than SAR ADC 100 when N>2. Conversely, SAR ADC 100, by using more comparators (i.e., N>2) may be able to operate at a higher frequency. Offset adjust DAC B 255 receives a common mode offset adjust value CM_OFF_VAL. Offset adjust DAC B 255 is operatively coupled to comparator B 211 to control the offset of comparator B 211. Offset adjust DAC A 251 is operatively coupled to comparator A 210 to control the offset of comparator A 210. SAR ADC 200 may be part of an integrated circuit.

In operation, under the control of clocking and control circuitry 240, register 220 is initially set to ½ of the maximum value that DAC 230 can output (e.g., 100000 for M=6). In a first cycle, comparator B 211 then compares the output of DAC 230 to the input voltage VIN to determine the value of the most-significant bit D[M−1]. The value of the most-significant bit is then loaded into register 220 which may cause DAC 230 to output a new analog voltage. In the next cycle, this new analog voltage is compared by comparator A 210 to the input voltage VIN to determine the value of the second most-significant bit. The value of the second most-significant bit is then loaded into register 220, and so on for M number of cycles-completing when comparator A 210 determines a 1 or 0 value for the least-significant bit D[0]. After M number of bit values have been determined, the value in register 220 is a digital representation of the analog voltage on SAR ADC's 200 input VIN. SAR ADC 200 may then proceed to convert another analog voltage on VIN by setting the value in register 220 to ½ of the maximum value that DAC 230 can output (e.g., 100000 for M=6) and proceeding through the same process.

In an embodiment, M is an even number. This ensures that comparator 210 is always the comparator producing the least-significant bit output by SAR ADC 200. However, other configurations are contemplated. For example, if M is odd and N=2, SAR ADC 200 could be configured such that comparators 210 and 211 each produce the least-significant bit on alternating conversion cycles. A multiplexor (not shown in FIG. 2) or other logic could be used to route the respective outputs of comparators 210 and 211 to the appropriate bit position of register 220.

In an embodiment, distribution calculation 250 monitors the least-significant bit values output by SAR ADC 200 over multiple analog to digital conversions. Distribution calculation 250 monitors the least-significant bit values output by SAR ADC 200 to determine whether a statistically significant mismatch in the number of 1's and 0's is occurring. If distribution calculation 250 determines that there is a statistically significant mismatch in the number of 1's and 0's occurring, distribution calculation 250 adjusts the value OFF_VAL which causes the voltage output by offset DAC 251 to change. The analog voltage output by offset DAC 251 controls the offset of comparator A 210.

If distribution calculation 250 determines that there are statistically more 0's that 1's being output by comparator 210, distribution calculation 250 may change the value of OFF_VAL such that the offset of comparator 210 is changed such that the there is an increased likelihood comparator 210 will output a 1 for any given comparison. Likewise, if distribution calculation 250 determines that there are statistically more 1's that 0's being output by comparator 210, distribution calculation 250 may change the value of OFF_VAL such that the offset of comparator 210 is changed such that the there is an increased likelihood comparator 210 will output a 0 for any given comparison.

In an embodiment, distribution calculation 250 is circuitry and/or software running on the same integrated circuit as the rest of SAR ADC 200. In another embodiment, distribution calculation 250 may be software running on a separate integrated circuit that can control the offset of comparator 210 (e.g., via writing to a register that controls the value OFF_VAL.)

Figure 3B:
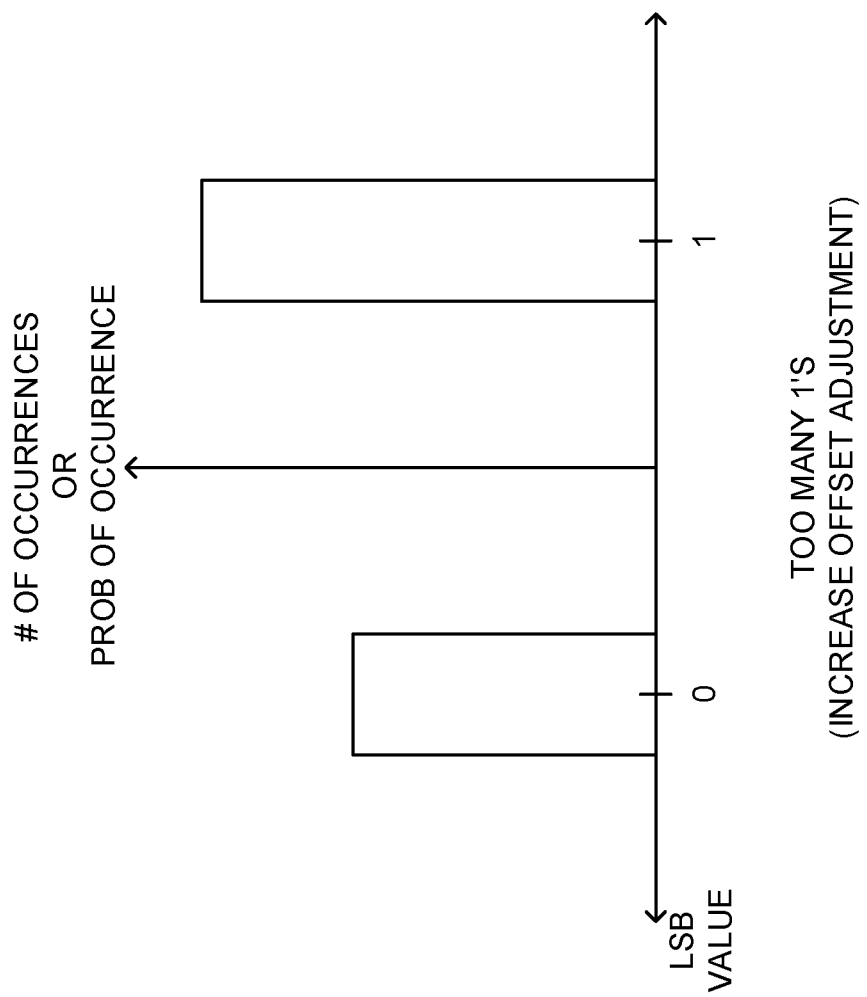

FIGS. 3A-3C are illustrations of the distribution of least-significant bit values given a random or well distributed input signal. FIG. 3A illustrates a distribution of least-significant bit values (or equivalently the probability of occurrence) that may not require an offset adjustment. Note that the distribution of 0's and 1's are equal or approximately equal in FIG. 3A. Thus, assuming the distribution in FIG. 3A represents a statistically large sample size (e.g., 1000, 10000, etc.), and the difference between the number of 1's and 0's is statistically equal (e.g., 1%-5% difference or less), then distribution calculation 150 and distribution calculation 250 would not adjust the offset of their respective least-significant bit comparator.

FIG. 3B illustrates a distribution of least-significant bit values (or equivalently the probability of occurrence) that may require an increased positive offset adjustment. Note that the distribution of 0's and 1's in FIG. 3B has significantly more 1's than 0's. Thus, assuming the distribution in FIG. 3B represents a statistically large sample size (e.g., 1000, 10000, etc.), and the difference between the number of 1's and 0's shows there are statistically more 1's (e.g., 5% or more 1's than 0's), then distribution calculation 150 and distribution calculation 250 would increase the offset of their respective least-significant bit comparator thereby increasing the number of least-significant bit 0's.

FIG. 3C illustrates a distribution of least-significant bit values (or equivalently the probability of occurrence) that may require a decreased offset adjustment. Note that the distribution of 0's and 1's in FIG. 3B has significantly more 0's than 1's. Thus, assuming the distribution in FIG. 3C represents a statistically large sample size (e.g., 1000, 10000, etc.), and the difference between the number of 1's and 0's shows there are statistically more 0's (e.g., 5% or more 0's than 1's), then distribution calculation 150 and distribution calculation 250 would decrease the offset of their respective least-significant bit comparator thereby decreasing the number of least-significant bit 0's.

Figure 4:
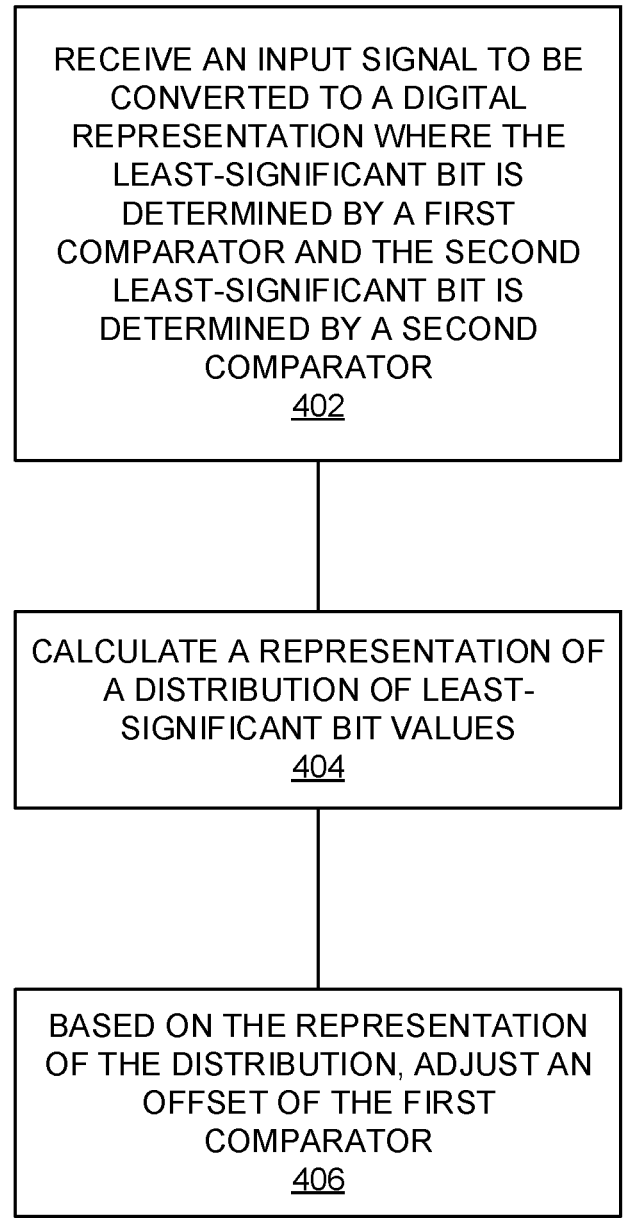
FIG. 4 is a flowchart illustrating a method of calibrating a least-significant bit comparator.

FIG. 4 is a flowchart illustrating a method of calibrating a least-significant bit comparator. The steps illustrated in FIG. 4 may be performed by SAR ADC 100, SAR ADC 200 and/or their components. It should be understood that the steps illustrated in FIG. 4 may be repeated iteratively, and/or repeated from time to time. For example, the steps in FIG. 4 may be performed before SAR ADC 100 is first used so that when normal operation begins, SAR ADC 100 will take accurate measurements. In another example, SAR ADC 100 may be periodically calibrated from time-to-time (e.g., once every 100 seconds, once every ten minutes, etc.) to ensure relatively slowly changing environmental conditions (e.g., temperature, supply voltage, etc.) do not affect the accuracy of the measurements taken by SAR ADC 100. In another example, known changing environmental conditions (e.g., change in temperature or supply voltage etc. by a threshold amount) may trigger a calibration sequence. In another example, external software and/or other control function external to SAR ADC 100 may trigger a calibration sequence based on other information/timing (e.g., a mode) not known to SAR ADC 100.

An input signal is received to be converted to a digital representation where the least-significant bit is determined by a first comparator and the second least-significant bit is determined by a second comparator (402). For example, the input signal VIN may be received by SAR ADC 200 where comparator A 210 determines the least-significant bit output by SAR ADC 200 and comparator B 211 determines the second least-significant bit output by SAR ADC 200.

The input signal is received to be converted to a digital representation may be any analog voltage to be converted to a digital value. This includes industrial (or consumer) measurement, voiceband audio, data acquisition, video, radio (e.g., IF sampling), etc. Thus, the input signal is received to be converted to a digital representation may represent, for example, temperature, light, humidity, pressure, speed, position, distance, an amount, an electrocardiographic signal, an RF signal, an audio signal, and/or any analog (or digital) physical property that may be sensed/received by analog circuitry/sensors. Conversion of physical properties in and around machines (e.g., automobiles, factory equipment) has enabled many recent technological advances. These areas include, for example, antilock brakes, robotics, climate control (e.g., thermostats). Conversion of an analog RF signal to digital values has enabled many recent advances in communications by replacing analog circuitry with computer functions (e.g., software radio, mobile communications, CDMA, OFDM, OFDMA, etc.)

A representation of a distribution of least-significant bit values is calculated (404). For example, distribution calculation 250 may calculate one or more of the following: difference in the number of 1's and 0's output over a period of time or number of conversions; an accumulated value where 1's increment the accumulator and 0's decrement the accumulator; total number of 0's and total number of 1's output over a period of time or number of conversions; probability of the occurrence of a 0 vs. the probability of the occurrence of a 1, etc.

Based on the representation, an offset of the first comparator is adjusted (406). For example, if the representation calculated in step 404 shows there are statistically more 1's (e.g., 5% or more 1's than 0's), then distribution calculation 200 increases the offset of comparator 210 thereby increasing the number of least-significant bit 0's. Likewise, if the representation calculated in step 404 shows there are statistically more 0's (e.g., 5% or more 0's than 1's), then distribution calculation 200 decreases the offset of comparator 210 thereby decreasing the number of least-significant bit 0's.

It should be understood that the offset adjustment techniques described herein may use a well distributed or random-like input signal. A constant input (i.e., DC) would necessarily result in statistically more 1's or 0's even though the offset of the least-significant bit comparator is correctly adjusted. This situation would result in a worst case calibration error of 1 bit (i.e., the least significant bit would be meaningless.) To address the possibility of a constant value input, a dither signal (typically greater than or equal to ½ LSB) may be added to or subtracted from the input to ensure that even when a constant value is input the SAR ADC, the least-significant bit will be, when the offset is properly adjusted, equally balanced between 1's and 0's.

Figure 5A:
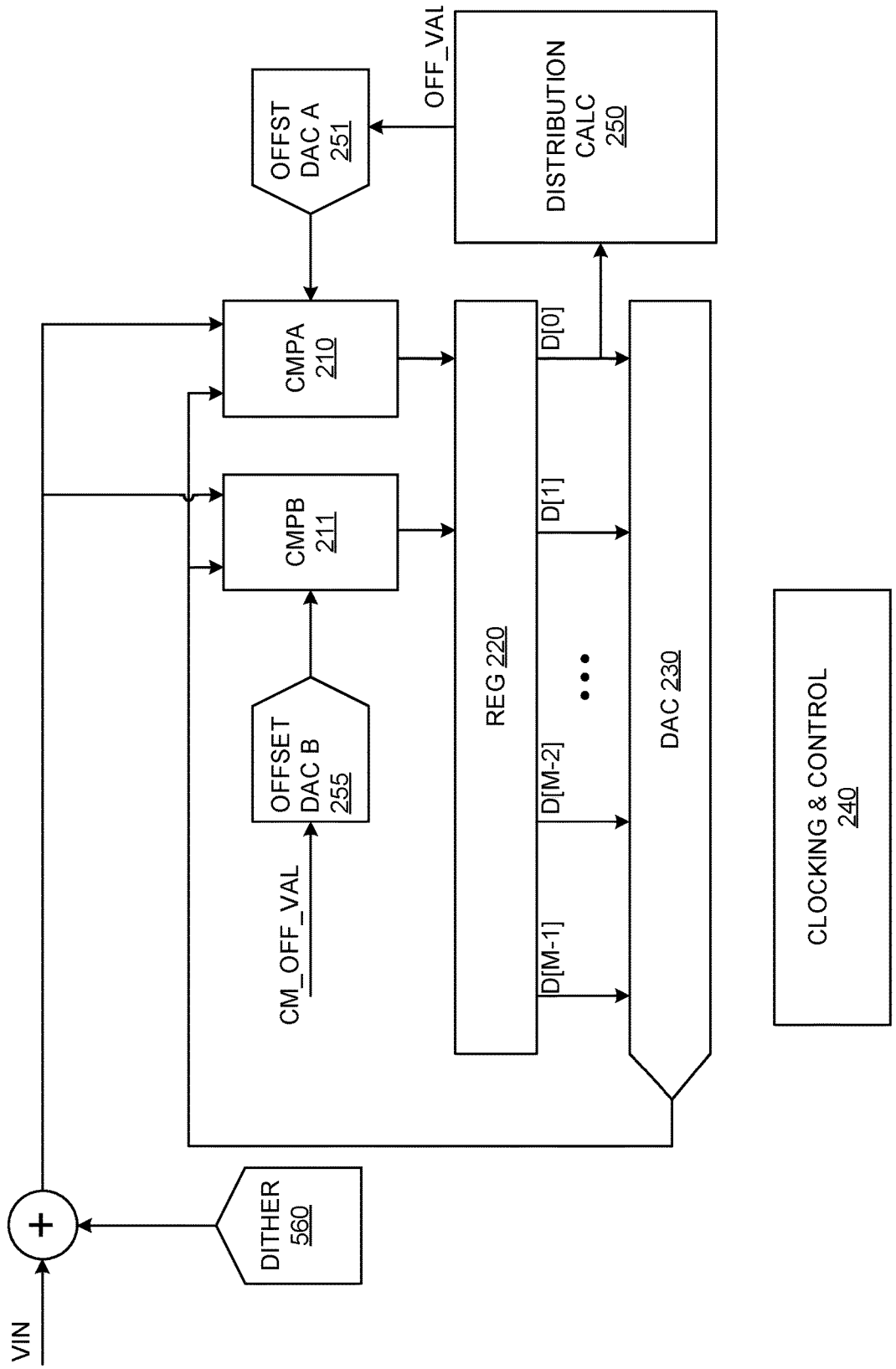
FIG. 5A is a block diagram illustrating a successive approximation register analog to digital converter with a dithered input.

FIG. 5A is a block diagram illustrating a successive approximation register analog to digital converter with a dithered input. SAR ADC 201 is functionally the same as SAR ADC 200 except with the addition of dither signal generator 560. The signal output by dither signal generator 560 is added to the input signal VIN such that even when a constant value is input the SAR ADC, the least-significant bit will be, when the offset is properly adjusted, equally balanced between 1's and 0's. SAR ADC 201 may be part of an integrated circuit.

Figure 5B:
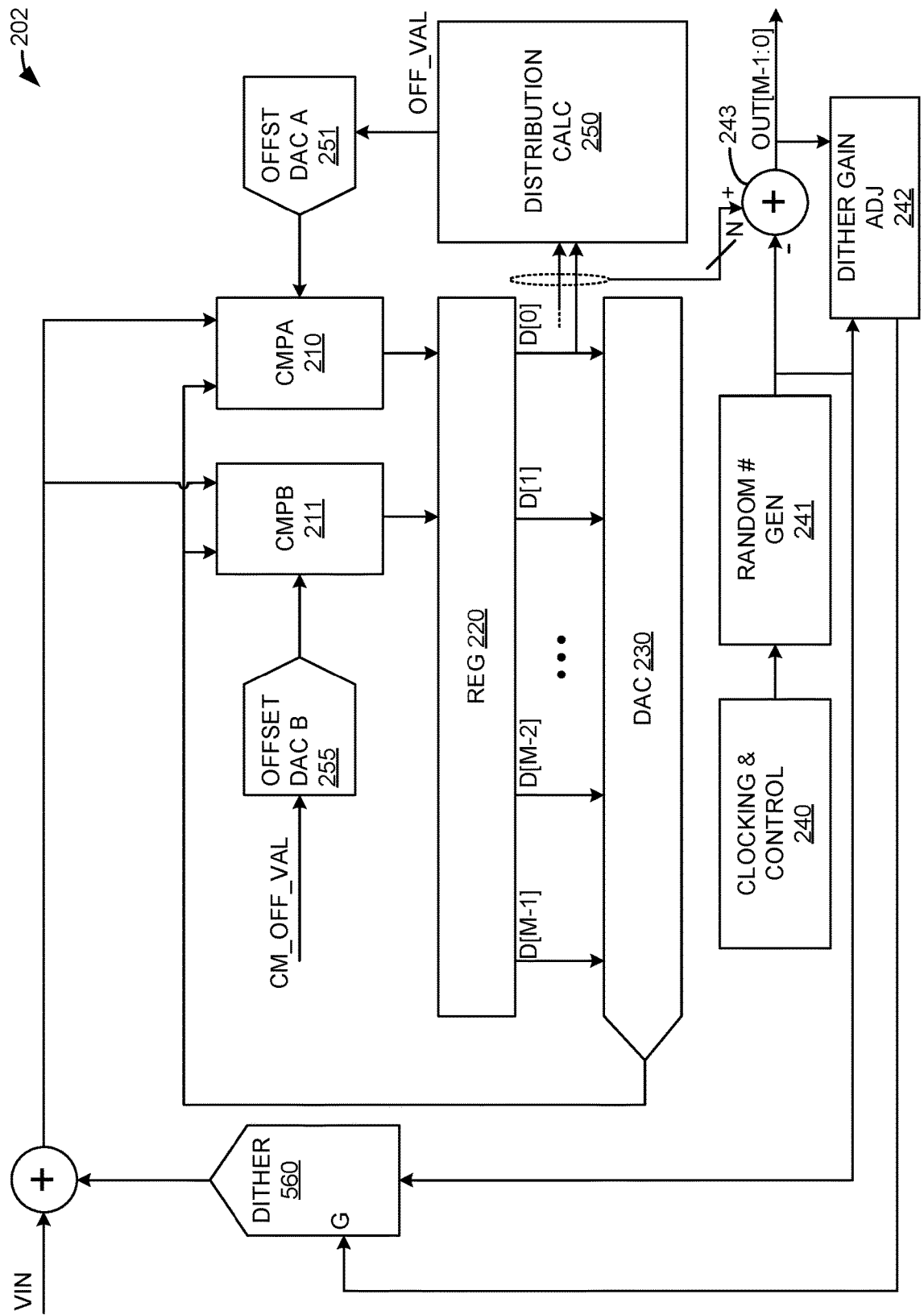
FIG. 5B is a block diagram illustrating another embodiment of a successive approximation register analog to digital converter with a dithered input.

FIG. 5B is a block diagram illustrating another embodiment of a successive approximation register analog to digital converter with a dithered input. Dithering the input to SAR ADC 202 is a method of ensuring that, at least relative to the least-significant bit, the analog property converted is well distributed or random input and should (when SAR ADC 202 is calibrated) result in roughly an equal number of 1 and 0 values for the least-significant bit (e.g., bit #0). SAR ADC 202 is functionally the same as SAR ADC 201 except with the addition of random number generator 241, dither gain adjust 242, and digital sum 243. Random number generator 241 controls dither 560 to provide a random dither signal that is added to the input signal. After SAR ADC 202 determines a digital representation D[M−1:0] for the input signal plus dither, sum 243 subtracts the amount of dither from the D[M−1:0] to produce an output OUT[M−1:0] representation that may not include the dither signal. Dither gain adjust 242 sets the gain of dither 560 such that when the random number from random number generator 241 is subtracted from D[M−1:0], OUT[M−1:0] may not include the contribution of the dither signal. SAR ADC 202 may be part of an integrated circuit.

Figure 6:
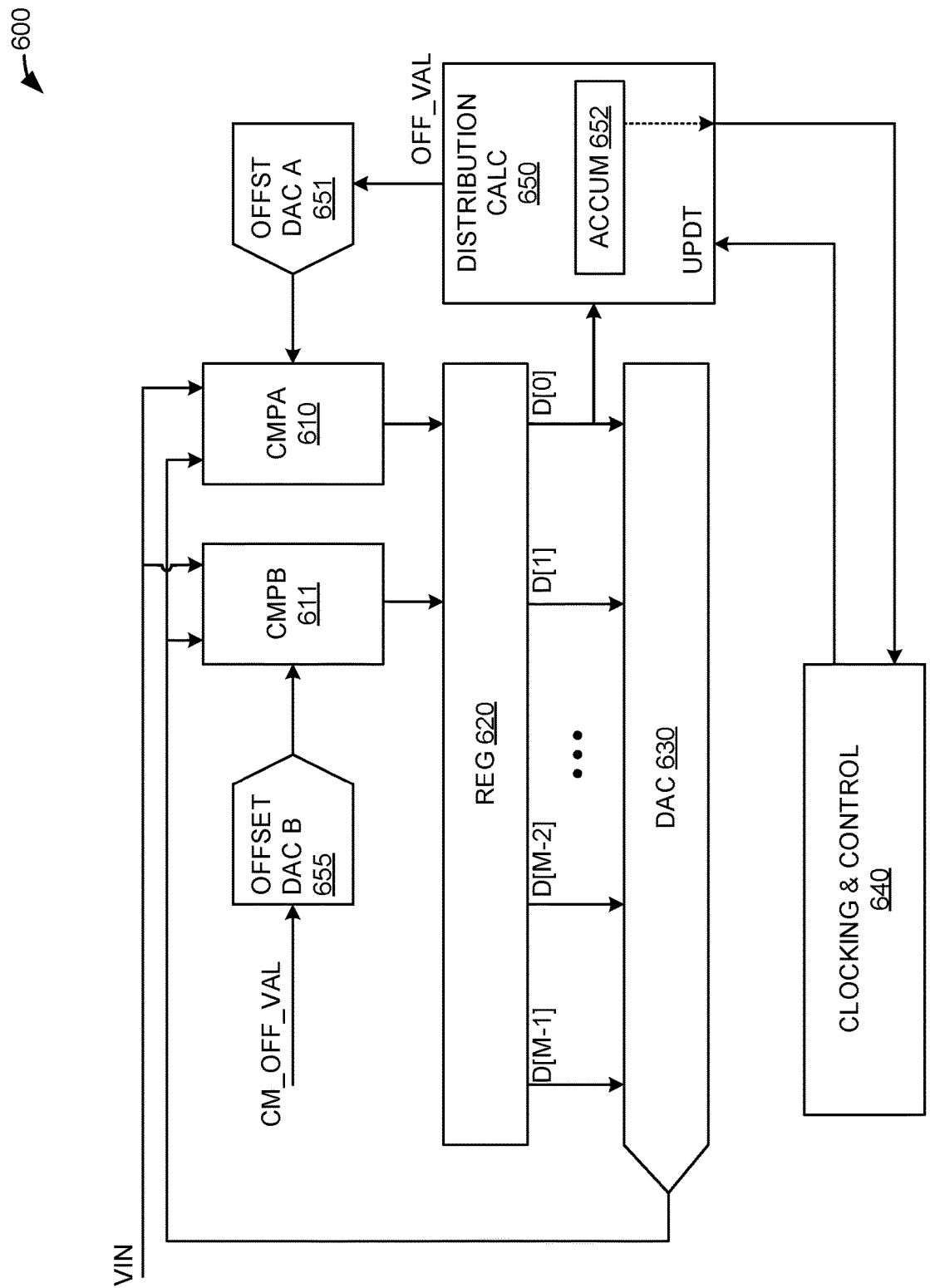
FIG. 6 is a block diagram illustrating a successive approximation register analog with a least-significant bit accumulator.

FIG. 6 is a block diagram illustrating a successive approximation register analog with a least-significant bit accumulator. In FIG. 6, SAR ADC 600 comprises comparator A 610, comparator B 611, M-bit register 620, M-bit digital to analog converter (DAC) 630, clocking and control circuitry 640, distribution calculation 650, offset adjust DAC A 651, and offset adjust DAC B 655. Distribution calculation 650 includes accumulator 652. Distribution calculation is operatively coupled to clocking and control 640. Distribution calculation is operatively coupled to clocking and control 640 so that the value held by accumulator 652 may be read and/or written (e.g., reset to 0.) Distribution calculation may be operatively coupled to clocking and control 640 to signal clocking and control 640 when the value held in accumulator 652 meets a threshold condition (e.g., exceeds a certain value, rolls over, etc.) SAR ADC 600 may be part of an integrated circuit.

SAR ADC 600 uses two comparators 610-611 in an alternating (a.k.a., ping-pong) fashion to convert the analog signal at its input (VIN) to M number of digital bits. Offset adjust DAC B 655 is operatively coupled to comparator B 611 to control the offset of comparator B 611. Offset adjust DAC A 651 is operatively coupled to comparator A 610 to control the offset of comparator A 610.

In operation, under the control of clocking and control circuitry 640, register 620 is initially set to ½ of the maximum value that DAC 630 can output (e.g., 100000 for M=6). In a first cycle, comparator B 611 then compares the output of DAC 630 to the input voltage VIN to determine the value of the most-significant bit D[M−1]. The value of the most-significant bit is then loaded into register 620 which may cause DAC 630 to output a new analog voltage. In the next cycle, this new analog voltage is compared by comparator A 610 to the input voltage VIN to determine the value of the second most-significant bit. The value of the second most-significant bit is then loaded into register 620, and so on for M number of cycles-completing when comparator A 610 determines a 1 or 0 value for the least-significant bit D[0]. After M number of bit values have been determined, the value in register 620 is a digital representation of the analog voltage on SAR ADC's 600 input VIN. SAR ADC 600 may then proceed to convert another analog voltage on VIN by setting the value in register 620 to ½ of the maximum value that DAC 630 can output (e.g., 100000 for M=6) and proceeding through the same process.

In an embodiment, M is an even number. This ensures that comparator 610 is always the comparator producing the least-significant bit output by SAR ADC 600. However, other configurations are contemplated. For example, if M is odd and N=2, SAR ADC 600 could be configured such that comparators 610 and 611 each produce the least-significant bit on alternating conversion cycles. A multiplexor (not shown in FIG. 2) or other logic could be used to route the respective outputs of comparators 610 and 611 to the appropriate bit position of register 620.

In an embodiment, distribution calculation 650 increments accumulator 652 according to the least-significant bit value output by SAR ADC 600. Over multiple analog to digital conversions cycles, if there is a mismatch in the number of 1's and 0's, accumulator 652 will gradually increase or decrease in value. Thus, accumulator 652 may be considered as a representation of an average of the least-significant bit values.

If there is no mismatch, accumulator 652 should hover around its initial value. Thus, over a period of time (or number of conversion cycles) the value in accumulator 652 can be used to determine whether there is a statistically significant disparity in the number of 1's and 0's occurring. If there is a statistically significant disparity in the number of 1's and 0's occurring (e.g., determined as a result of the value in accumulator 652 meeting a threshold value and/or rolling over), distribution calculation 650 may adjust the value OFF_VAL thereby adjusting the offset of comparator A 610.

In an embodiment, distribution calculation 650 is circuitry and/or software running on the same integrated circuit as the rest of SAR ADC 600. In another embodiment, distribution calculation 650 may be software running on a separate integrated circuit that can control the offset of comparator 610 (e.g., via writing to a register that controls the value OFF_VAL.)

Figure 7:
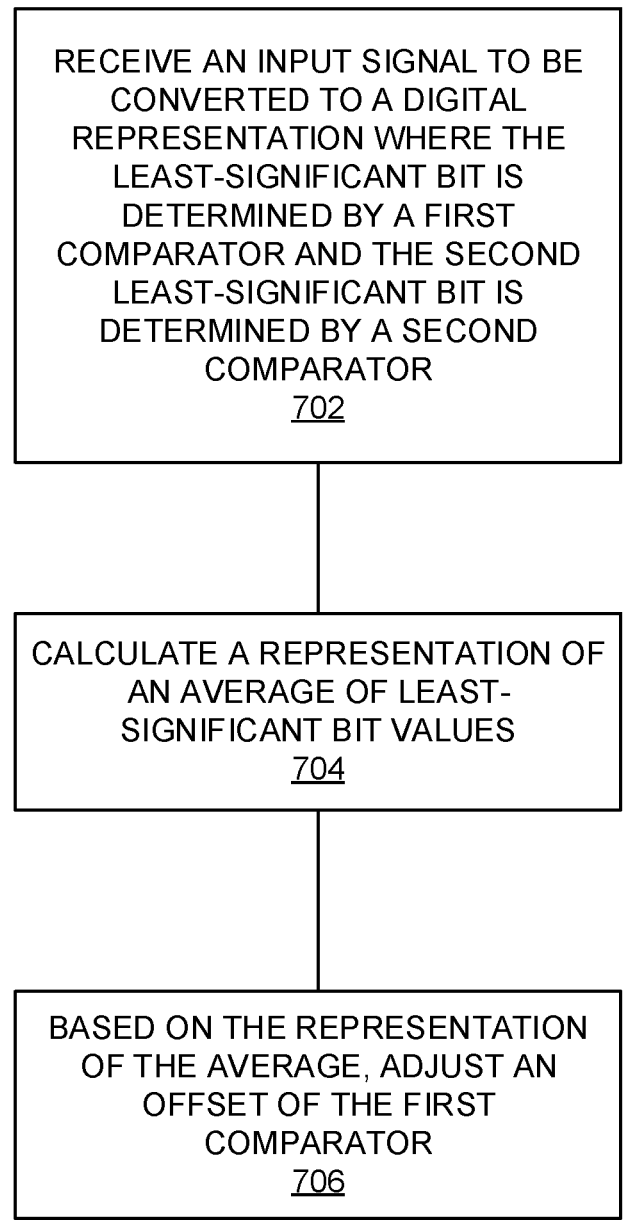
FIG. 7 is a flowchart illustrating a method of calibrating a least-significant bit comparator.

FIG. 7 is a flowchart illustrating a method of calibrating a least-significant bit comparator. The steps illustrated in FIG. 7 may be performed by SAR ADC 100, SAR ADC 200, SAR ADC 201, SAR ADC 600, and/or their components. An input signal is received to be converted to a digital representation where the least-significant bit is determined by a first comparator and the second least-significant bit is determined by a second comparator (702). For example, the input signal VIN may be received by SAR ADC 600 where comparator A 610 determines the least-significant bit output by SAR ADC 600 and comparator B 611 determines the second least-significant bit output by SAR ADC 600.

A representation of an average of least-significant bit values is calculated (704). For example, distribution calculation 650 may increment accumulator 652 for every least-significant bit that is a 1, and decrement accumulator 652 for every least-significant bit that is a 0. Thus, the value in accumulator 652 will be representative of an average of the least-significant bit values.

Based on the representation of the average, an offset of the first comparator is adjusted (706). For example, if accumulator 652 exceeds a threshold value (e.g., indicates that over a certain period of time there have been more than 1000 more 1's than 0's), distribution calculation 650 may increase the offset of comparator A 610. Likewise, if accumulator 652 exceeds a threshold value in the other direction (e.g., indicates that over a certain period of time there have been more than 1000 more 0's than 1's), distribution calculation 650 may decrease the offset of comparator A 610.

Figure 8A:
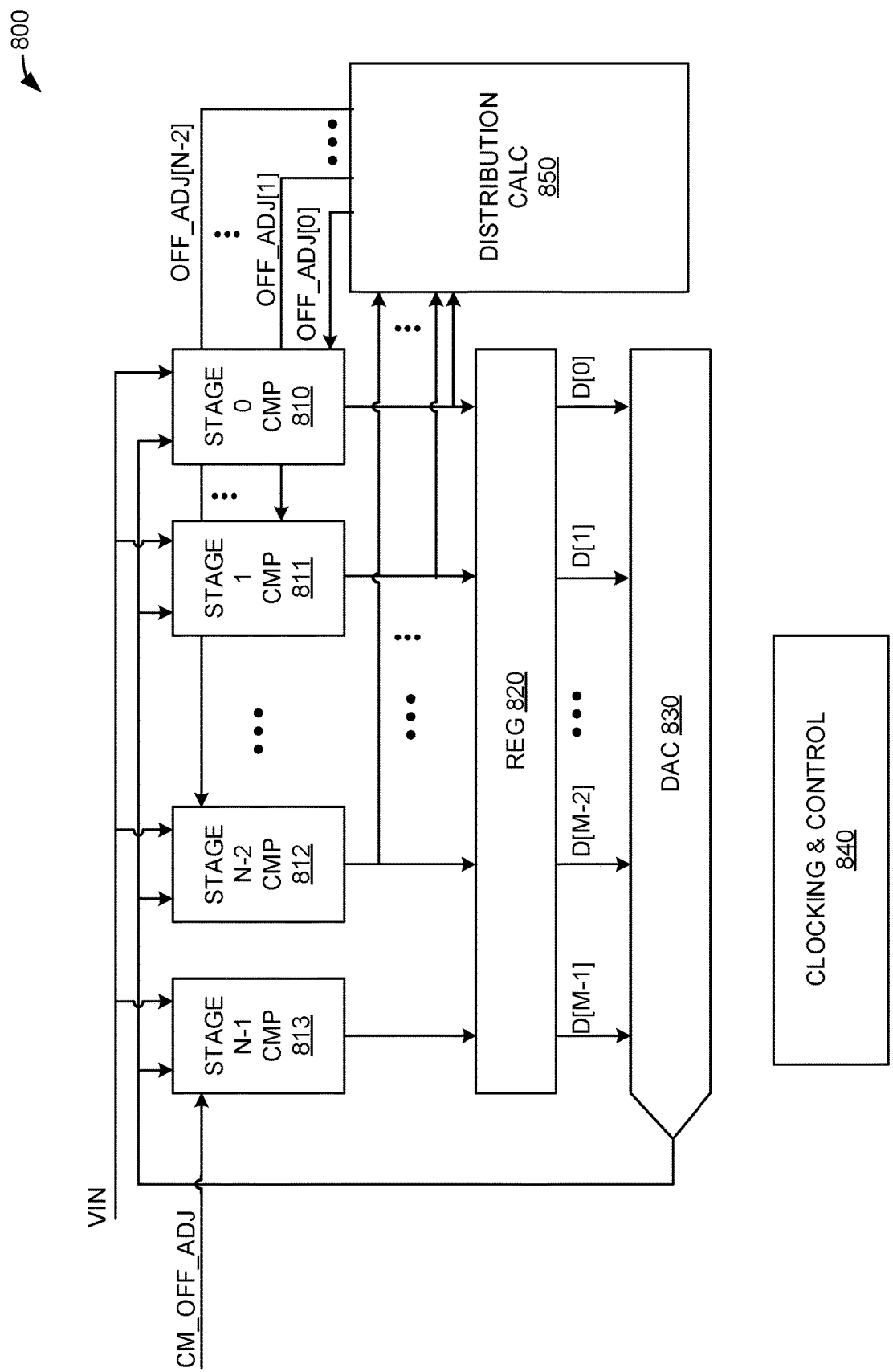
FIG. 8A is a block diagram illustrating a successive approximation register (SAR) analog to digital converter (ADC) using 2 or more comparators.

FIG. 8A is a block diagram illustrating a successive approximation register (SAR) analog to digital converter (ADC) using 2 or more comparators. In FIG. 8A, SAR ADC 800 comprises N number of comparators 810-813, M-bit register 820, M-bit digital to analog converter (DAC) 830, clocking and control circuitry 840, and distribution calculation 850. SAR ADC 800 uses N number of comparators to convert the analog signal at its input (VIN) to M number of digital bits, where N is greater than or equal to 2, and M is an arbitrary integer that determines the resolution of SAR ADC 800. An offset adjust signal CM_OFF_ADJ is operatively coupled to stage N−1 comparator 813 to control the offset of comparator 813. CM_OFF_ADJ may be controlled or set by circuitry (e.g., a DAC) not shown in FIGS. 8A-8B. SAR ADC 800 may be part of an integrated circuit.

In operation, under the control of clocking and control circuitry 840, register 820 is initially set to ½ of the maximum value that DAC 830 can output (e.g., 100000 for M=6). In a first cycle, stage N−1 comparator 813 then compares the output of DAC 830 to the input voltage VIN to determine the value of the most-significant bit D[M−1]. The value of the most-significant bit is then loaded into register 820 which may cause DAC 830 to output a new analog voltage. In the next cycle, this new analog voltage is compared by stage N−2 comparator 812 to the input voltage VIN to determine the value of the second most-significant bit. The value of the second most-significant bit is then loaded into register 820, and so on for M number of cycles. After M number of bit values have been determined, the value in register 820 is a digital representation of the analog voltage on SAR ADC's 800 input VIN. SAR ADC 800 may then proceed to convert another analog voltage on VIN by setting the value in register 820 to ½ of the maximum value that DAC 830 can output (e.g., 100000 for M=6) and proceeding through the same process.

In an embodiment, M is an integer multiple of N. This ensures that comparators 810-812 are always the comparator producing the N−1 least-significant bit output by SAR ADC 800. However, other configurations are contemplated. For example, if M is not an integer multiple of N, SAR ADC 800 could be configured such that the N−1 least-significant bits are produced by a rotating set of comparators 810-813. A multiplexor (not shown in FIG. 8A) or other logic could be used to route the respective outputs of comparators 810-812 to the appropriate bit positions of register 820.

In an embodiment, distribution calculation 850 monitors the values of the least-significant N−1 bits resolved by SAR ADC 800 over multiple analog to digital conversions. Distribution calculation 850 monitors the values of the N−1 least-significant bits resolved by SAR ADC 800 to determine whether a statistically significant mismatch in the number of 1's and 0's is occurring in each monitored bit. If distribution calculation 850 determines that there is a statistically significant mismatch in the number of 1's and 0's occurring, distribution calculation 850 makes an adjustment to the offset of the comparator that resolved that bit 810-812.

For example, if distribution calculation 850 determines that there are statistically more 0's that 1's being output by comparator 810, distribution calculation 850 may change the offset of comparator 810 (e.g., via the signal OFF_ADJ[0]) to change the threshold of comparator 810 so then there is an increased likelihood comparator 810 will output a 1 for any given comparison. Likewise, if distribution calculation 850 determines that there are statistically more 1's that 0's being output by comparator 810, distribution calculation 850 may change the offset of comparator 810 (e.g., via the signal OFF_ADJ[0]) to change the threshold of comparator 810 so then there is an increased likelihood comparator 810 will output a 0 for any given comparison.

In an embodiment, distribution calculation 850 is circuitry and/or software running on the same integrated circuit as the rest of SAR ADC 800. In another embodiment, distribution calculation 850 may be software running on a separate integrated circuit that can control the offset of comparator 810 (e.g., via writing to a register that controls a DAC that outputs the OFF_ADJ[0] signal.)

Figure 8B:
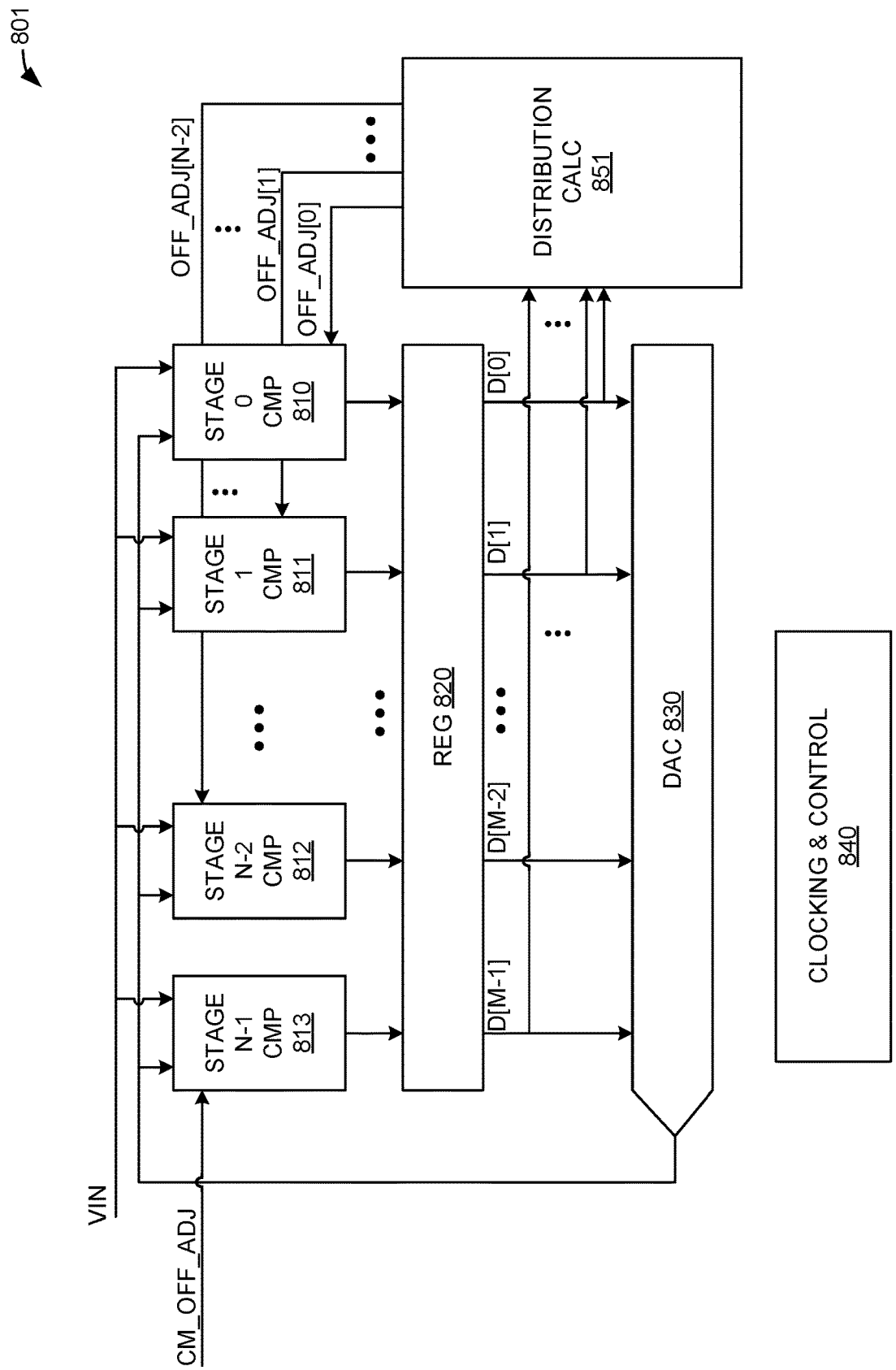
FIG. 8B is a block diagram illustrating another embodiment of a successive approximation register (SAR) analog to digital converter (ADC) using 2 or more comparators.

FIG. 8B is a block diagram illustrating another embodiment of a successive approximation register (SAR) analog to digital converter (ADC) using 2 or more comparators. SAR ADC 801 in FIG. 8B is similar to SAR ADC 800 in FIG. 8A, except that distribution calculation 851 can receive all or a subset of the values D[M−1:0]. Distribution calc 851 may receive (all or a subset of) the values D[M−1:0] from register 820 rather than directly from comparators 810-813. Because M is typically greater than N, it may take more conversion cycles for distribution calculation 851 of SAR ADC 801 to accumulate a statistically significant number of samples of D[M−2:0] when compared to distribution calculation 850 of SAR ADC 800.

It should be understood that distribution calc 851 (and similarly distribution calc 850) may select the values/digits needed to determine whether a statistically significant mismatch in the number of 1's and 0's is occurring in the monitored bits (or a selected subset). The values/digits selected may be determined by the algorithm used by distribution calc 851 (and similarly distribution calc 850) to determine whether there is a statistically significant mismatch.

For example, in one iteration, distribution calc 851 may accumulate statistics based on only the values of D[1] in order to adjust the offset of comparator 811. In another example, the distribution calc 851 may accumulate statistics based on D[N−2:0] to adjust the offsets of comparators 810-812. In another example, distribution calc 851 may accumulate statistics (e.g., correlate) based on one or more of the values of the higher-order bits (D[M−1:2]) and the values of D[1]. This would allow, for example, statistics to be accumulated when the output of DAC 830 is known to be relatively quiescent and/or active (e.g., look at D[1] only when the preceding bits are 1000 . . . 0 or 0111 . . . 1 so that the output of DAC 830 has not changed in some number of approximation cycles.) It should be understood that certain subsets and/or bit patterns for D[M−1:0] may, in some circumstances, result in a better or worse statistical sample space for the adjustment of a given comparator 813-810.

Figure 9A:
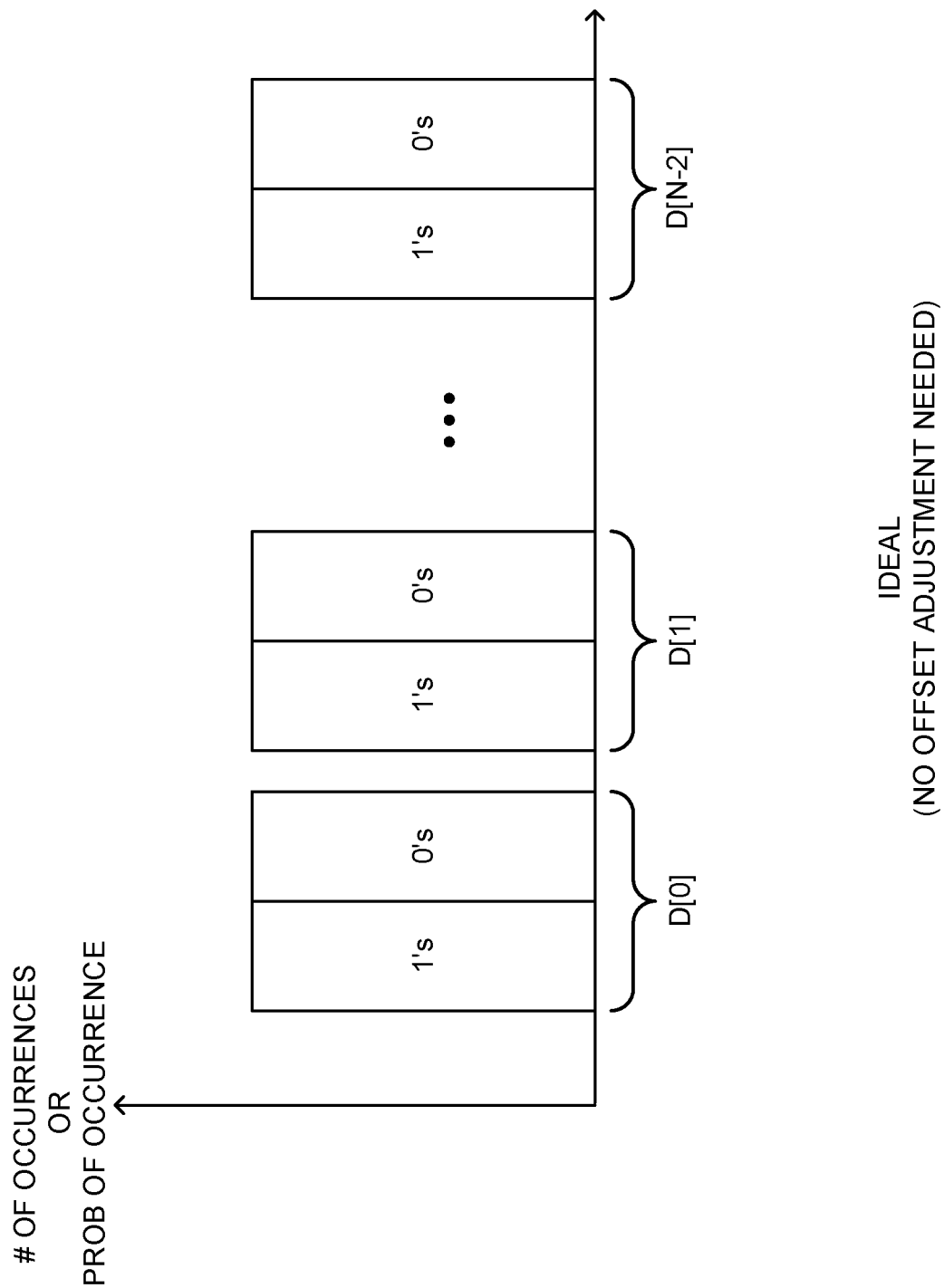
Figure 9B:
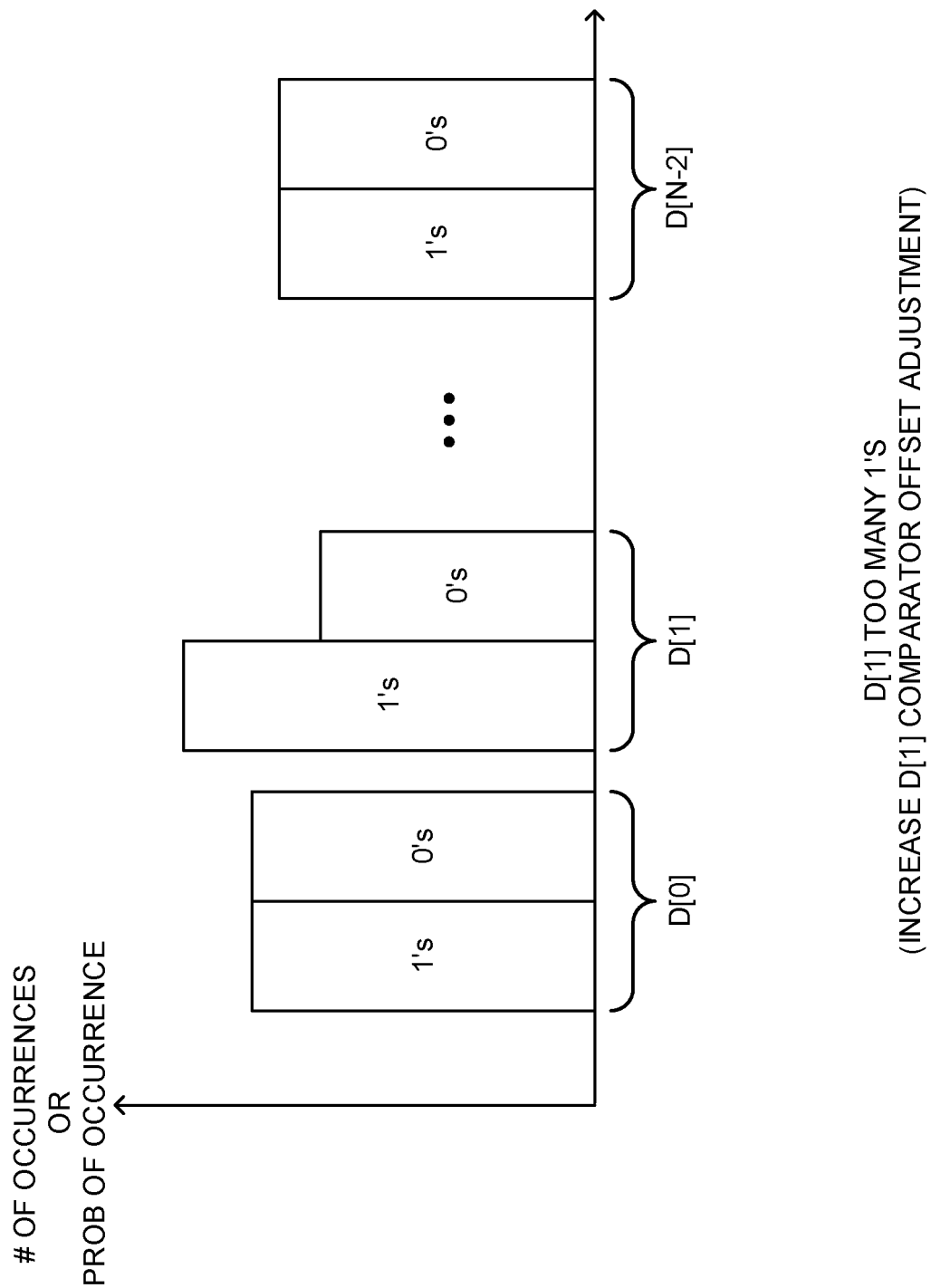

FIGS. 9A-9C are illustrations of the distribution of bit values given a random or well distributed input signal. FIG. 9A illustrates a distribution of bit values (or equivalently the probability of occurrence) that may not require an offset adjustment. Note that the distribution of 0's and 1's are equal or approximately equal for each output digit (bit) illustrated in FIG. 9A. Thus, assuming the distribution in FIG. 9A represents a statistically large sample size (e.g., 1000, 10000, etc.), and the difference between the number of 1's and 0's is statistically equal (e.g., 1%-5% difference or less), then distribution calculation 850 would not adjust the offset of any of the comparators that resolve the illustrated bits.

FIG. 9B illustrates a distribution of bit values (or equivalently the probability of occurrence) that may require an increased positive offset adjustment for at least one comparator. Note that the distribution of 0's and 1's associated with bit D[1] in FIG. 9B has significantly more 1's than 0's. Thus, assuming the distribution in FIG. 9B represents a statistically large sample size (e.g., 1000, 10000, etc.), and the difference between the number of 1's and 0's shows there are statistically more 1's (e.g., 5% or more 1's than 0's), then distribution calculation 850 would increase the offset of the D[1] comparator that produced this distribution, thereby increasing the number of 0's occurring at bit D[1].

FIG. 9C illustrates a distribution of bit values (or equivalently the probability of occurrence) that may require a decreased offset adjustment. Note that the distribution of 0's and 1's associated with bit D[1] in FIG. 9B has significantly more 1's than 0's. Thus, assuming the distribution in FIG. 9B represents a statistically large sample size (e.g., 1000, 10000, etc.), and the difference between the number of 1's and 0's shows there are statistically more 1's (e.g., 5% or more 1's than 0's), then distribution calculation 850 would increase the offset of the D[1] comparator that produced this distribution, thereby increasing the number of 0's occurring at bit D[1]. Likewise, note that the distribution of 0's and 1's associated with bit D[N−2] in FIG. 9C has significantly more 0's than 1's. Thus, assuming the distribution in FIG. 9C represents a statistically large sample size (e.g., 1000, 10000, etc.), and the difference between the number of 1's and 0's shows there are statistically more 0's (e.g., 5% or more 0's than 1's), then distribution calculation 850 would decrease the offset of the D[N−2] comparator that produced this distribution, thereby decreasing the number of 0's occurring at bit D[N−2].

Figure 10:
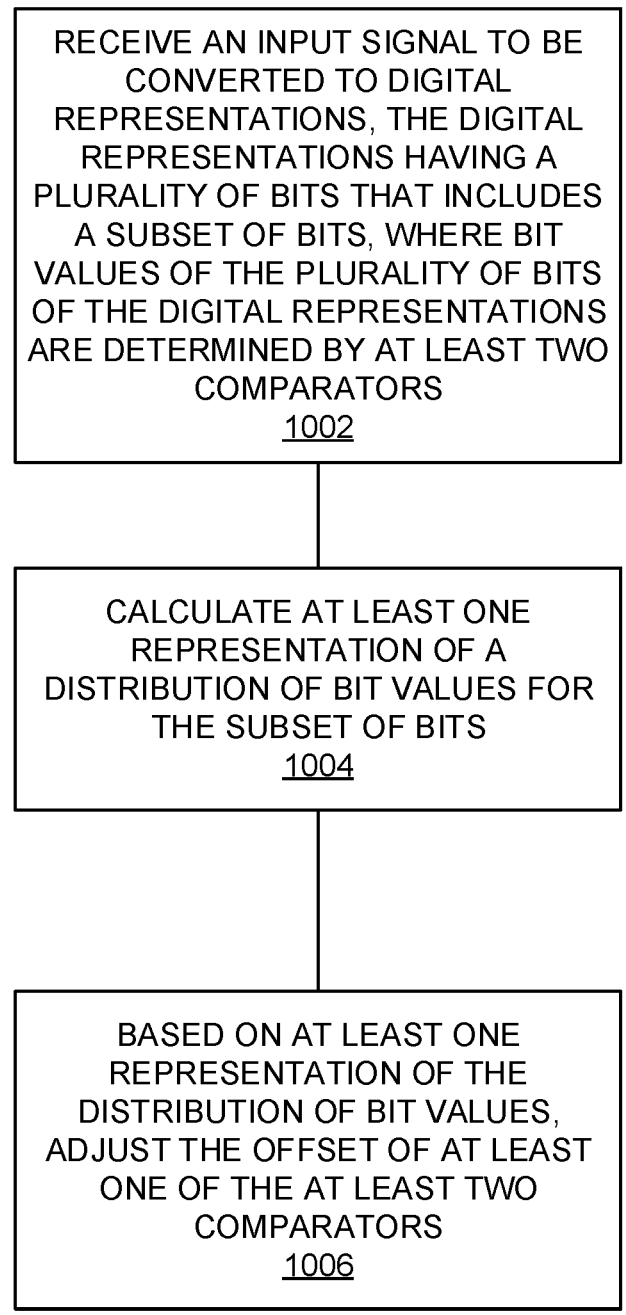
FIG. 10 is a flowchart illustrating a method of calibrating at least one comparator.

FIG. 10 is a flowchart illustrating a method of calibrating at least one comparator. The steps illustrated in FIG. 10 may be performed by SAR ADC 100, SAR ADC 200, SAR ADC 201, SAR ADC 202, SAR ADC 800, SAR ADC 801, and/or their components. An input signal to be converted to digital representations is received where the digital representations have a plurality of bits that includes a subset of bits, where bit values of the plurality of bits of the digital representations are determined by at least two comparators (1002). For example, the input signal VIN may be received by SAR ADC 800 where stage 0 comparator 810 determines the least-significant bit output by SAR ADC 800, stage 1 comparator 811 determines the second least-significant bit output by SAR ADC 800, and so on with stage N−2 comparator 812 determining the second most-significant bit output by SAR ADC 800. These bits may be grouped into one or more subsets to be analyzed statistically (e.g., least-significant X number of bits, where X<N).

At least one representation of a distribution of bit values for the subset of bits is calculated (1004). For example, distribution calculation 850 may calculate, for each of the bits associated with a subset of comparators 810-812 used in SAR ADC 800, one or more of the following: difference in the number of 1's and 0's output over a period of time or number of conversions; an accumulated value where 1's increment the accumulator and 0's decrement the accumulator; total number of 0's and total number of 1's output over a period of time or number of conversions; probability of the occurrence of a 0 vs. the probability of the occurrence of a 1, etc.

Based on at least one representation of the distribution of bit values, adjust the offset of at least one of the at least two the comparators (1006). For example, if the representation calculated in step 1004 for a given bit (e.g., bit D[1]) shows there are statistically more 1's (e.g., 5% or more 1's than 0's), then distribution calculation 850 increases the offset of the corresponding comparator 810-812 (e.g., for bit D[1], comparator 811) thereby increasing the number of least-significant bit 0's associated with that bit. Likewise, if the representation calculated in step 1004 shows there are statistically more 0's (e.g., 5% or more 0's than 1's), then distribution calculation 850 decreases the offset of the corresponding comparator 810-812 (e.g., for bit D[1], comparator 811) thereby decreasing the number of least-significant bit 0's associated with that bit.

It should be understood that the offset adjustment techniques described herein may use a well distributed or random-like input signal. A constant input (i.e., DC) would necessarily result in statistically more 1's or 0's even though the offset of the least-significant bit comparator is correctly adjusted. This situation would result in a worst case calibration error of 1 bit (i.e., the least significant bit would be meaningless.) To address the possibility of a constant value input, a dither signal (typically of +/−½ LSB) may be added to the input to ensure that even when a constant value is input the SAR ADC, the least-significant bit will be, when the offset is properly adjusted, equally balanced between 1's and 0's.

Figure 11:
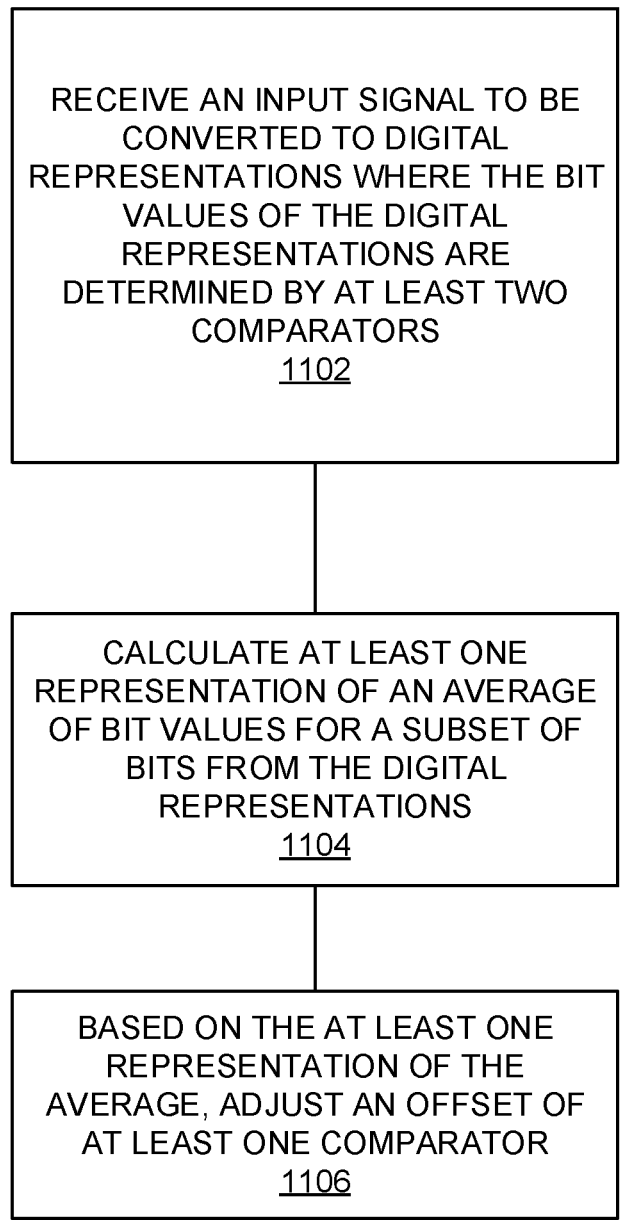
FIG. 11 is a flowchart illustrating a method of calibrating one or more comparators.

FIG. 11 is a flowchart illustrating a method of calibrating one or more comparators. The steps illustrated in FIG. 11 may be performed by SAR ADC 100, SAR ADC 200, SAR ADC 201, SAR ADC 202, SAR ADC 800, SAR ADC 801, and/or their components. An input signal to be converted to digital representations where the bit values of the digital representations are determined by at least two comparators is received (1102). For example, the input signal VIN may be received by SAR ADC 800 where stage 0 comparator 810 determines the least-significant bit output by SAR ADC 800, stage 1 comparator 811 determines the second least-significant bit output by SAR ADC 800, and so on with stage N−2 comparator 812 determining the second most-significant bit output by SAR ADC 800.

At least one representation of an average of bit values for a subset of bits from the digital representations is calculated (1104). For example, the bits D[N−1:0] determined by SAR 800 may be grouped into one or more subsets to be analyzed statistically (e.g., least-significant X number of bits, where X<N). The average bit values over a period of time or number of conversions for each of these bits (digits) may be calculated independent or each other. In another example, distribution calculation 850 may increment an associated accumulator for every occurrence of a 1 at that bit, and decrement the associated accumulator for every occurrence of a 0 at that bit. Thus, the value in an associated accumulator will be representative of an average of the bit values that have occurred at that bit.

Based on the at least one representation of the average, an offset of at least one comparator is adjusted (1106). For example, if an accumulator that is associated with a given bit exceeds a threshold value (e.g., indicates that over a certain period of time there have been more than 1000 more 1's than 0's), distribution calculation 850 may increase the offset of the comparator associated with that bit. Likewise, if the accumulator associated with that bit exceeds a threshold value in the other direction (e.g., indicates that over a certain period of time there have been more than 1000 more 0's than 1's), distribution calculation 850 may decrease the comparator associated with that bit.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of SAR ADC 100, SAR ADC 200, SAR ADC 201, SAR ADC 202, SAR ADC 600, SAR ADC 800, SAR ADC 801, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 12:
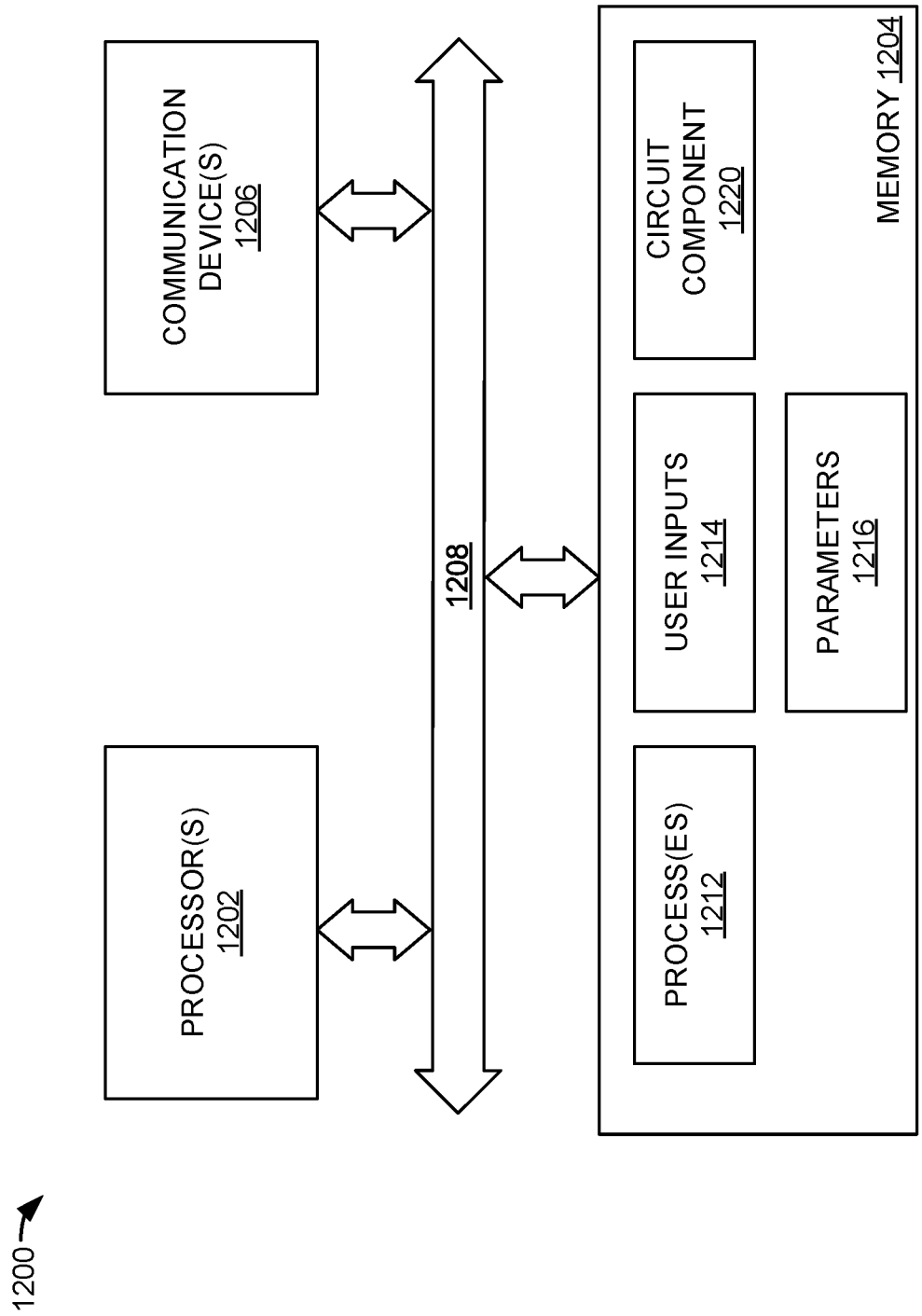
FIG. 12 is a block diagram of a processing system.

FIG. 12 is a block diagram illustrating one embodiment of a processing system 1200 for including, processing, or generating, a representation of a circuit component 1220. Processing system 1200 includes one or more processors 1202, a memory 1204, and one or more communications devices 1206. Processors 1202, memory 1204, and communications devices 1206 communicate using any suitable type, number, and/or configuration of wired and/or wireless connections 1208.

Processors 1202 execute instructions of one or more processes 1212 stored in a memory 1204 to process and/or generate circuit component 1220 responsive to user inputs 1214 and parameters 1216. Processes 1212 may be any suitable electronic design automation (EDA) tool or portion thereof used to design, simulate, analyze, and/or verify electronic circuitry and/or generate photomasks for electronic circuitry. Representation 1220 includes data that describes all or portions of SAR ADC 100, SAR ADC 200, SAR ADC 201, SAR ADC 202, SAR ADC 600, SAR ADC 800, SAR ADC 801, and their components, as shown in the Figures.

Representation 1220 may include one or more of behavioral, register transfer, logic component, transistor, and layout geometry-level descriptions. Moreover, representation 1220 may be stored on storage media or communicated by carrier waves.

Data formats in which representation 1220 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1214 may comprise input parameters from a keyboard, mouse, voice recognition interface, microphone and speakers, graphical display, touch screen, or other type of user interface device. This user interface may be distributed among multiple interface devices. Parameters 1216 may include specifications and/or characteristics that are input to help define representation 1220. For example, parameters 1216 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1204 includes any suitable type, number, and/or configuration of non-transitory computer-readable storage media that stores processes 1212, user inputs 1214, parameters 1216, and circuit component 1220.

Communications devices 1206 include any suitable type, number, and/or configuration of wired and/or wireless devices that transmit information from processing system 1200 to another processing or storage system (not shown) and/or receive information from another processing or storage system (not shown). For example, communications devices 1206 may transmit circuit component 1220 to another system. Communications devices 1206 may receive processes 1212, user inputs 1214, parameters 1216, and/or circuit component 1220 and cause processes 1212, user inputs 1214, parameters 1216, and/or circuit component 1220 to be stored in memory 1204.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of reducing the offset error of a successive approximation analog-to-digital converter, comprising:
   receiving an input signal to be converted to digital representations, the digital representations having a plurality of bits that includes at least a subset of bits, where bit values of the plurality of bits of the digital representations are determined by at least two comparators, at least two of the at least two comparators having unequal offset voltages;
   calculating indicators of distributions of bit values of the subset of bits; and,
   based on the indicators of distributions of bit values of the subset of bits, adjusting the offsets of at least one of the at least two the comparators.

2. The method of claim 1, wherein the input signal is effectively random with respect to the subset of bits.

3. The method of claim 1, wherein a signal that affects the distribution of bit values for the subset of bits is applied to a precursor input signal.

4. The method of claim 1, further comprising:
   calculating a representation of an average of bit values for each of the subset of bits over a plurality of conversions to digital representations; and,
   using the representation of the average for each of the subset of bits as the indicators of distributions for the corresponding one of the subset of bits.

5. The method of claim 4, wherein the representation of the average of bit values for at least one of the subset of bits is calculated using an accumulator circuit.

6. The method of claim 1, wherein the at least two comparators consists of two comparators.

7. The method of claim 6, wherein a first one of the two comparators determines bit values for a least-significant bit of the digital representations and a second one of the two comparators determines bit values for a second least-significant bit of the digital representations.

8. An integrated circuit, comprising:
   at least two comparators configured to operate as part of a successive approximation analog-to-digital converter, the successive approximation analog-to-digital converter to convert an input signal to digital representations, the digital representations having a plurality of bits that includes at least a subset of bits where bit values of the plurality of bits are determined by respective outputs of the at least two comparators, at least two of the at least two comparators having unequal offset voltages;
   means for calculating indicators of distributions of bit values of the subset of bits; and, means for, based on the indicators of distributions of bit values of the subset of bits, adjusting the offsets of at least one of the at least two the comparators.

9. The integrated circuit of claim 8, wherein the input signal is to be effectively random with respect to each bit in the subset of the plurality of bits.

10. The integrated circuit of claim 9, further comprising:
a signal adding circuit to apply, to a precursor input signal that the input signal is based on, a signal that affects the distribution of bit values for the subset of bits.

11. The integrated circuit of claim 8, further comprising:
an averaging circuit to calculate at least one representation of an average of bit values of the subset of the plurality of bits over a plurality of conversion cycles, at least one of the indicators of distributions of bit values of the subset of bits of the plurality of bits to be based on the at least one representation of the average of bit values of the subset of the plurality of bits.

12. The integrated circuit of claim 8, further comprising:
at least one accumulating circuit to calculate at least one representation of the average of bit values of the subset of the plurality of bits.

13. The integrated circuit of claim 8, wherein the at least two comparators comprises a first comparator and a second comparator.

14. The integrated circuit of claim 13, wherein the first comparator determines bit values for a least-significant bit of the digital representations and the second comparator determines bit values for a second least-significant bit of the digital representations, the subset of the plurality of bits consisting of the least-significant bit the digital representations.

15. A system, comprising:
analog-to-digital conversion (ADC) circuitry configured to convert an input signal to digital representations, the digital representations having bit values of a plurality of bits determined by at least two comparators, at least two of the at least two comparators to have unequal offset voltages;
offset sensing circuitry to calculate indicators of the distributions of bit values of the subset of the plurality of bits; and
a calibration circuit to, based on the indicators of the distributions of bit values of the subset of the plurality of bits, adjust the offset of one or more comparators.

16. The system of claim 15, wherein the indicators of the distributions of bit values of the subset of the plurality of bits is to be calculated external to an integrated circuit that includes the ADC circuitry.

17. The system of claim 15, wherein the offset sensing circuitry comprises:
an accumulator circuit to calculate at least one representation of the average of bit values of the subset of the plurality of bits.

18. The circuit system of claim 15, wherein the offset sensing circuitry is to accumulate at least a portion of bit values of at least one of the subset of the plurality of bits to determine at least one of the indicators of the distributions of bit values of the subset of the plurality of bits.

19. The circuit system of claim 18, wherein the at least two comparators comprises a first comparator and a second comparator.

20. The system of claim 19, wherein the first comparator determines bit values for a least-significant bit of the digital representations and the second comparator determines bit values for a second least-significant bit of the digital representations, the subset of the plurality of bits consisting of the least-significant bit the digital representations.

* * * * *